(12) United States Patent
Sawada et al.

(10) Patent No.: US 6,566,159 B2
(45) Date of Patent: May 20, 2003

(54) METHOD OF MANUFACTURING TANDEM THIN-FILM SOLAR CELL

(75) Inventors: Toru Sawada, Uji (JP); Masashi Yoshimi, Kobe (JP)

(73) Assignee: Kaneka Corporation, Osaka (JP)

( * ) Notice: Subject to any disclaimer, the term of this patent is extended or adjusted under 35 U.S.C. 154(b) by 1 day.

(21) Appl. No.: 09/970,332

(22) Filed: Oct. 2, 2001

(65) Prior Publication Data

US 2002/0059726 A1 May 23, 2002

(30) Foreign Application Priority Data

| Oct. 4, 2000 | (JP) | .................................. | 2000-304417 |
| Feb. 8, 2001 | (JP) | .................................. | 2001-032428 |
| Feb. 8, 2001 | (JP) | .................................. | 2001-032429 |

(51) Int. Cl.[7] .............................................. H01L 21/00
(52) U.S. Cl. .............................. 438/57; 438/73; 438/74; 438/485
(58) Field of Search ................................ 438/57, 73, 74, 438/96, 97, 98, 295, 298, 958, 485, 482, 488

(56) References Cited

U.S. PATENT DOCUMENTS 5,336,623 A * 8/1994 Sichanugrist et al.
5,403,404 A * 4/1995 Arya et al. .................. 136/249
5,977,476 A * 11/1999 Guha et al. .................. 136/249
2002/0168794 A1 * 11/2002 Kondo et al. ................. 438/96

FOREIGN PATENT DOCUMENTS

| EP | 0559143 | 9/1993 |
| EP | 0631329 | * 12/1994 |
| JP | 05-243596 | 9/1993 |

* cited by examiner

Primary Examiner—Savitri Mulpuri
(74) Attorney, Agent, or Firm—Hogan & Hartson, LLP (57) ABSTRACT

A method of manufacturing a tandem thin-film solar cell is provided, the solar cell including a plurality of photoelectric conversion units stacked on a substrate, the photoelectric conversion units each having a p-type layer, an i-type photoelectric conversion layer and an n-type layer deposited in this order from a light-incident side of the solar cell, and at least a rear unit among the photoelectric conversion units that is furthest from the light-incident side being a crystalline unit including a crystalline i-type photoelectric conversion layer. The manufacturing method includes the steps of forming at least one of the units on the substrate by plasma CVD and immediately thereafter forming an i-type boundary layer to a thickness of at most 5 nm by plasma CVD, and thereafter removing the substrate into the atmosphere to expose a surface of the i-type boundary layer to the atmosphere and then forming a crystalline unit on the i-type boundary layer by plasma CVD.

18 Claims, 5 Drawing Sheets

METHOD OF MANUFACTURING TANDEM THIN-FILM SOLAR CELL

BACKGROUND OF THE INVENTION

1. Field of the Invention

The present invention relates to a method of manufacturing a tandem-type thin-film solar cell and more particularly to the method able to improve flexibility of the manufacturing process and production efficiency without deteriorating performance of the solar cell.

2. Description of the Background Art

In recent years, the variety of thin-film solar cells has been increasing and not only the conventional amorphous thin-film solar cells but also crystalline thin-film solar cells have been developed. Moreover, tandem-type (including hybrid type) thin-film solar cells which each have stacked amorphous and/or crystalline photoelectric conversion units are going to be put into practical use.

A semiconductor thin-film solar cell generally includes a first electrode, at least one semiconductor thin-film photoelectric conversion unit and a second electrode that are stacked successively on a substrate having an insulating property at least on its surface. One photoelectric conversion unit includes an i-type layer sandwiched between a p-type layer and an n-type layer.

The i-type layer occupying a major part of the overall thickness of the photoelectric conversion unit is substantially an intrinsic semiconductor layer mainly in which photoelectric conversion process occurs. Accordingly, the i-type photoelectric conversion layer is preferably thicker in terms of light absorption, while the thickness thereof increased more than necessary increases the cost and time required for depositing the i-type layer.

On the other hand, the p-type and n-type layers serve to cause a diffusion potential in the photoelectric conversion unit. The magnitude of the diffusion potential determines a value of an open circuit voltage which is one of important characteristics of the thin-film solar cell. However, these p-type and n-type layers are inactive layers that do not directly contribute to the photoelectric conversion. Therefore, light absorbed by impurities in the p-type and n-type layers results in optical loss which makes no contribution to power generation. Then, the p-type and n-type layers preferably have respective thicknesses as thin as possible in the range which can cause a sufficient diffusion potential.

Accordingly, a photoelectric conversion unit or thin-film solar cell is referred to, regardless of whether p-type and n-type conductive layers thereof are amorphous or crystalline, as amorphous unit or amorphous thin-film solar cell if the i-type photoelectric conversion layer occupying the major part thereof is amorphous, and as crystalline unit or crystalline thin-film solar cell if the i-type layer is crystalline.

Conversion efficiency of a thin-film solar cell can be enhanced by stacking at least two photoelectric conversion units thereby making the cell tandem-type. Specifically, a front unit including a photoelectric conversion layer having a wide band gap is placed on a light-incident side of the thin-film solar cell and a rear unit including a photoelectric conversion layer (of Si—Ge alloy for example) having a narrow band gap is placed behind the front unit. Then, photoelectric conversion for a wide wavelength range of incident light is achieved to enhance the conversion efficiency of the entire solar cell. In particular, a tandem-type thin-film solar cell including both of amorphous and crystalline photoelectric conversion units is sometimes referred to as hybrid thin-film solar cell.

For example, an i-type amorphous silicon is capable of photoelectrically converting light having a wavelength up to approximately 800 nm, while an i-type crystalline silicon is capable of photoelectrically converting light having a still longer wavelength up to 1100 nm. Here, the amorphous silicon photoelectric conversion layer has a large light absorption coefficient and its thickness of 0.3 μm or smaller is enough for light absorption. On the other hand, the crystalline silicon photoelectric conversion layer having a small light absorption coefficient preferably has a thickness of approximately 2 to 3 μm or greater for absorbing sufficient longer-wavelength light. In other words, it is usually desirable for the crystalline photoelectric conversion layer to have a thickness approximately ten times as large as that of the amorphous photoelectric conversion layer.

When the tandem-type thin-film solar cell includes both of the amorphous and crystalline units, the optimum plasma CVD conditions for forming the amorphous unit are different from those for forming the crystalline unit. Then, the amorphous and crystalline units are preferably formed under respective optimum conditions in separate plasma CVD apparatuses each including a vacuum chamber for CVD process. In addition, formation of the crystalline unit requires a longer time compared with that required for formation of the amorphous unit. Then, it may be desirable to rapidly produce the crystalline units through a plurality of manufacturing lines over the amorphous units produced through a single manufacturing line. Moreover, even when the tandem-type thin-film solar cell includes a plurality of crystalline units only, a front unit closer to a light-incident side of the cell and a rear unit arranged behind the front unit are made to have their respective thicknesses and other different characteristics in order to optimize the light absorption efficiency. Then, it is often desirable to form respective units by separate plasma CVD apparatuses.

However, under the situation as described above, when a p-i-n-type amorphous unit including a junction of p-i-n in this order from a transparent substrate is formed and the substrate is then removed from a plasma CVD apparatus temporarily into the atmosphere and further introduced into another plasma CVD apparatus to form a p-i-n crystalline unit thereon, a resultant tandem thin-film solar cell has photoelectric conversion characteristics inferior to that of a tandem thin-film solar cell manufactured by successively forming both units without taking out the substrate into the atmosphere. This fact has actually been experienced by the inventors of the present invention. Specifically, respective photoelectric conversion efficiencies were compared by means of absolute values thereof and the former is inferior to the latter by at least 0.5%.

SUMMARY OF THE INVENTION

An object of the present invention in consideration of the fact experienced by the inventors is to provide a method of manufacturing a tandem thin-film solar cell to improve flexibility of a manufacturing process and production efficiency thereof without deteriorating performance of the tandem thin-film solar cell.

According to an aspect of the present invention, a method of manufacturing a tandem thin-film solar cell is provided. The solar cell includes a plurality of photoelectric conversion units stacked on a substrate which each include a p-type layer, an i-type photoelectric conversion layer and an n-type layer formed in this order from a light-incident side of the solar cell. At least a rear unit among the photoelectric conversion units furthest from the light-incident side is a crystalline unit including a crystalline i-type photoelectric conversion layer. The method includes the steps of forming at least one of the units on the substrate by plasma CVD and immediately thereafter forming an i-type boundary layer to a thickness of at most 5 nm by plasma CVD, and thereafter removing the substrate into the atmosphere to expose a surface of the i-type boundary layer to the atmosphere and then forming a crystalline unit on the i-type boundary layer by plasma CVD.

Preferably, when the photoelectric conversion units each include a p-type layer, an i-type photoelectric conversion layer and an n-type layer in this order from the substrate, an additional n-type layer is formed by plasma CVD immediately before the crystalline unit is formed on the i-type boundary layer.

Preferably, an amorphous unit including an amorphous i-type photoelectric conversion layer is formed on the substrate as a firstly formed unit and as a front unit closest to the light-incident side.

Preferably, a source gas containing $SiH_4$ diluted with $H_2$ may be used for the plasma CVD.

According to another aspect also of the present invention, a method of manufacturing a tandem thin-film solar cell is provided. The solar cell includes a plurality of stacked photoelectric conversion units which each include a p-type layer, an i-type photoelectric conversion layer and an n-type layer deposited in this order on a transparent substrate. At least a rear unit among the photoelectric conversion units furthest from the substrate is a crystalline unit including a crystalline i-type photoelectric conversion layer. The method includes the steps of forming at least one of the units on the substrate by plasma CVD and thereafter removing the substrate into the atmosphere to expose, to the atmosphere, an outermost surface of the unit having already been formed, and then exposing the outermost surface to hydrogen plasma and immediately thereafter forming the crystalline unit by plasma CVD without removing the substrate into the atmosphere.

Preferably, at least one of the units is formed on the substrate by plasma CVD, an i-type boundary layer is immediately thereafter formed to a thickness of at most 5 nm by plasma CVD and then the substrate is removed into the atmosphere.

Substantially the same pressure may be used in the same vacuum chamber to expose the outermost surface of the unit previously exposed to the atmosphere to hydrogen plasma and to thereafter deposit the p-type layer of the crystalline unit by plasma CVD.

Preferably, after the exposure to hydrogen plasma and before deposition of the p-type layer of the crystalline unit, an additional n-type microcrystalline intermediate layer is deposited by plasma CVD, and the n-type microcrystalline intermediate layer may be deposited at substantially the same gas pressure as that at which the exposure to hydrogen plasma is performed.

Preferably, an amorphous unit including an amorphous i-type photoelectric conversion layer is formed on the substrate as a firstly formed unit.

Preferably, a source gas containing $SiH_4$ diluted with $H_2$ is used for the plasma CVD.

According to still another aspect also of the present invention, a method of manufacturing a tandem thin-film solar cell is provided. The solar cell includes a plurality of stacked photoelectric conversion units which each include a p-type layer, an i-type photoelectric conversion layer and an n-type layer deposited in this order on a transparent substrate. At least a rear unit among the photoelectric conversion units furthest from the substrate is a crystalline unit including a crystalline i-type photoelectric conversion layer. The method includes the steps of forming the n-type layer included in at least one of the units on the substrate by plasma CVD with a relatively low dopant concentration and thereafter removing the substrate into the atmosphere to expose a surface of the low-concentration n-type layer to the atmosphere, and performing plasma CVD to thereafter form an n-type intermediate layer on the low-concentration n-type layer previously exposed to the atmosphere, the intermediate layer having a higher concentration than that of the low-concentration n-type layer, and immediately thereafter form the crystalline unit.

The low-concentration n-type layer preferably has a dopant concentration less than $1.5 \times 10^{20}$ cm$^{-3}$ and the n-type intermediate layer with higher concentration preferably has a dopant concentration more than $5 \times 10^{20}$ cm$^{-3}$.

Preferably, the surface of the low-concentration n-type layer exposed to the atmosphere is then exposed to hydrogen plasma and immediately thereafter the n-type intermediate layer with higher concentration is formed by plasma CVD.

Substantially the same gas pressure may be used in the same vacuum chamber to expose the surface to hydrogen plasma, deposit the n-type intermediate layer by plasma CVD and deposit the p-type layer of the crystalline unit on the intermediate layer by plasma CVD.

Preferably, an amorphous unit including an amorphous i-type photoelectric conversion layer is formed on the substrate as a firstly formed unit.

Preferably, a source gas containing $SiH_4$ diluted with $H_2$ may be used for the plasma CVD.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The inventors of the present invention investigated the reason for the above-described inferior photoelectric conversion characteristics of the tandem thin-film solar cell manufactured by forming the p-i-n-type amorphous unit on the substrate and thereafter removing the substrate from a plasma CVD apparatus temporarily to the atmosphere and then to another plasma CVD apparatus to form the p-i-n-type crystalline unit as compared with the photoelectric conversion characteristics of the tandem thin-film solar cell manufactured by successively forming both units without removing the substrate into the atmosphere. As a result, one reason for this has been considered as follows. Specifically, the successively formed amorphous and crystalline units include a microcrystalline layer formed as an n-layer of the amorphous unit (n-layer is more likely to be crystallized than p-layer), and microcrystals in the n-layer function as nuclei for crystal growth on which the crystalline unit of a good quality can be formed. On the other hand, when the amorphous unit is formed and thereafter exposed temporarily to the atmosphere, oxidation and contamination caused on the surface of the n-layer hinder crystallization of the subsequently formed crystalline unit.

In addition, if the microcrystalline n-layer is doped with phosphorus, the surface thereof tends to become porous. This tendency is more pronounced particularly with increase of the dopant amount. Then, it is considered that the porous surface of the n-layer exposed to the atmosphere is more likely to be oxidized and contaminated as compared with a flat surface.

Preferred embodiments of the present invention are now described below in conjunction with the drawings based on such an analysis by the inventors as discussed above. It is noted that the dimensional relation regarding thickness and length for example is appropriately changed for the purpose of clarifying and simplifying the drawings and thus the drawings do not represent actual dimensional relationship. The same reference numerals in the drawings represent the same or corresponding components.

Figure 1:
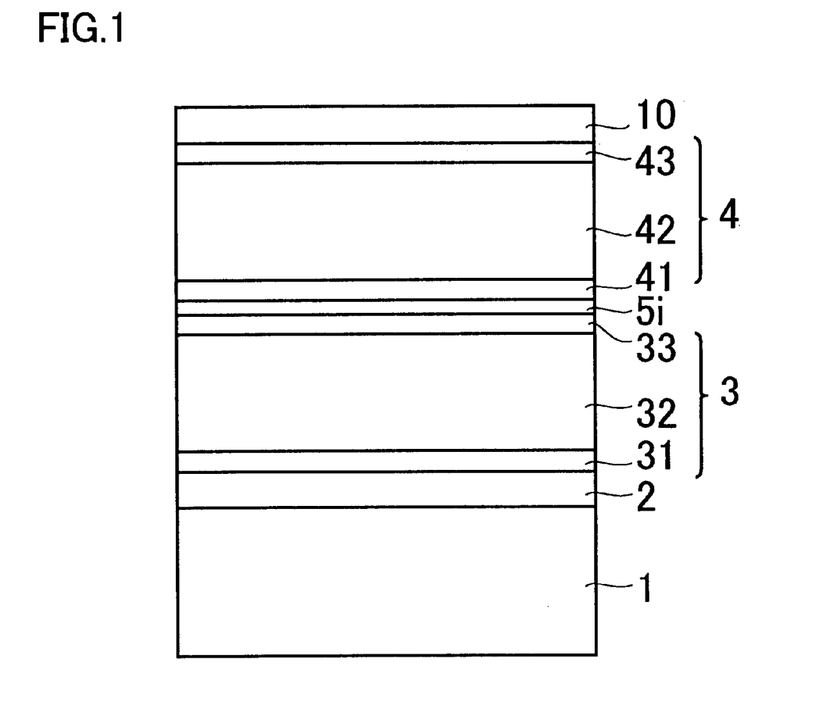
FIG. 1 is a schematic cross section showing a tandem thin-film solar cell manufactured by a method according to an embodiment of the present invention.

FIG. 1 shows a schematic cross section of a tandem thin-film solar cell manufactured by a method according to an embodiment of the present invention. Specifically, the solar cell includes an insulating substrate 1 on which a first electrode 2 is formed. On the first electrode 2, a first photoelectric conversion unit 3 is formed that includes a layer 31 of one conductivity type, a photoelectric conversion layer 32 of substantially intrinsic semiconductor and a layer 33 of opposite conductivity type that are deposited successively by plasma CVD. Then, a boundary layer 5i of substantially intrinsic semiconductor is deposited by plasma CVD to a thickness of 5 nm or smaller which can cause the tunnel effect.

After this, substrate 1 is removed from a plasma CVD apparatus to the atmosphere to allow the surface of boundary layer 5i to be exposed to the atmosphere. Substrate 1 is then moved into another plasma CVD apparatus to deposit layer 41 of one conductivity type, a substantially intrinsic crystalline photoelectric conversion layer 42 and a layer 43 of opposite conductivity type that are included in a second photoelectric conversion unit 4, and finally a second electrode 10 is formed.

According to the above-described method of manufacturing the tandem thin-film solar cell, although boundary layer 5i of intrinsic semiconductor is exposed to the atmosphere, the surface thereof is less likely to deteriorate compared with the surface of opposite conductivity type layer 33. Crystalline photoelectric conversion unit 4 thus formed by plasma CVD on such a boundary layer 5i exhibits good crystalline properties as compared to that formed directly on opposite conductivity type layer 33 exposed to the atmosphere. In this way, it is possible to lessen the adverse influence caused by the fact that substrate 1 is temporarily moved to the atmosphere after the first photoelectric conversion unit 3 is formed.

When the first unit 3 and the second unit 4 can accordingly be formed by separate CVD apparatuses, the most appropriate CVD conditions for achieving the best characteristics desired for respective units can be determined separately for these units and accordingly it could be possible to improve the performance of the tandem thin-film solar cell itself. In addition, a plurality of manufacturing lines are usable for each unit to enhance the production efficiency. Further, use of these plasma CVD apparatuses allows maintenance of the apparatuses to be carried out by turns and smoothly.

Figure 2:
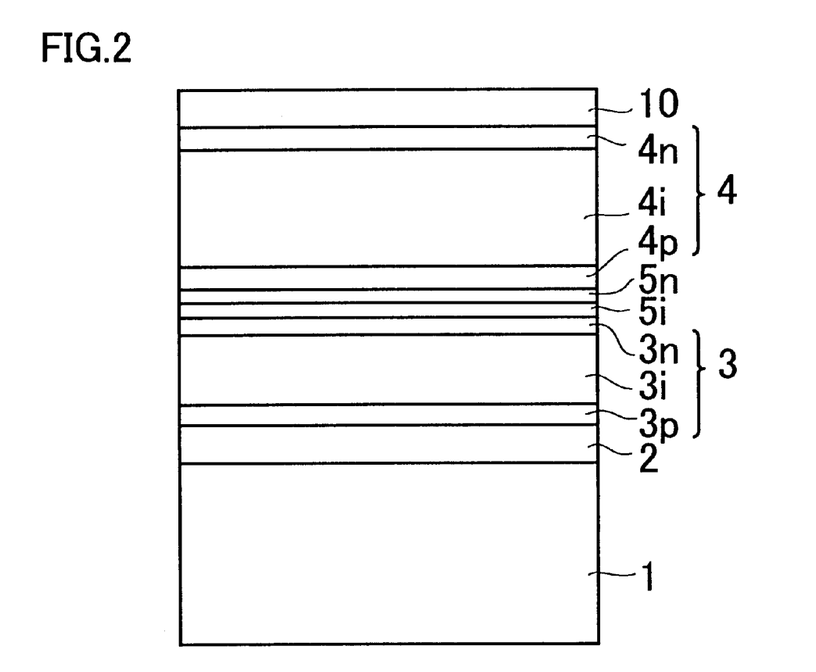
FIG. 2 is a schematic cross section showing a hybrid thin-film solar cell manufactured by a method according to another embodiment of the present invention.

FIG. 2 shows a schematic cross section of a hybrid thin-film solar cell manufactured by a method according to another embodiment of the present invention. The solar cell includes a transparent substrate 1 of glass for example on which a transparent electrode 2 of transparent conductive oxide is formed. On transparent electrode 2, an amorphous photoelectric conversion unit 3 is formed that includes a p-type layer 3p, an amorphous i-type photoelectric conversion layer 3i of substantially intrinsic semiconductor and an n-type layer 3n deposited successively by plasma CVD, and thereafter an i-type boundary layer 5i of substantially intrinsic semiconductor is deposited by plasma CVD to a thickness of 5 nm or smaller.

Then, transparent substrate 1 is removed from a plasma CVD apparatus to the atmosphere to expose a surface of i-type boundary layer 5i to the atmosphere. Transparent substrate 1 is thereafter moved into another plasma CVD apparatus to firstly deposit an additional n-type layer 5n on i-type boundary layer 5i by plasma CVD. Then, on the additional n-type layer 5n, a crystalline photoelectric conversion unit 4 is formed that includes a p-type layer 4p, a crystalline i-type photoelectric conversion layer 4i of substantially intrinsic semiconductor and an n-type layer 4n successively formed by plasma CVD. Finally, a rear metal electrode 10 is formed.

The embodiment as shown in FIG. 2 differs from the embodiment in FIG. 1 in that the former has the additional n-type layer 5n deposited by plasma CVD before crystalline photoelectric conversion unit 4 is formed. In general, p-type layer is less likely to be crystallized than n-type layer. The additional n-type layer 5n can readily be microcrystallized. The additional n-type layer 5n thus functions as nuclei for crystal growth, on which crystalline unit 4 of a good quality can be formed.

In order for each photoelectric conversion unit to efficiently absorb light in the tandem thin-film solar cells manufactured by the methods according to the above-described embodiments, light to be photoelectrically converted is allowed to enter the unit from its p-type layer side. When a tandem thin-film solar cell is a hybrid thin-film solar cell including both of amorphous and crystalline units, the amorphous photoelectric conversion unit capable of absorbing shorter wavelength light is arranged as a front unit closer to the light incident side, while the crystalline photoelectric conversion unit capable of absorbing longer wavelength light is arranged as a rear unit distant from the light incident side.

The embodiments as above have been described for only the two-stage tandem thin-film solar cell having two stacked photoelectric conversion units. Needless to say, however, the present invention is also applicable to a tandem thin-film solar cell including photoelectric conversion units of more than two stages.

An experimental example of the method of manufacturing an integrated hybrid thin-film solar battery including a stacked structure corresponding to the second embodiment shown in FIG. 2 is hereinafter described in conjunction with FIG. 3 together with a referential example and a comparative example.

EXPERIMENTAL EXAMPLE 1

Figure 3:
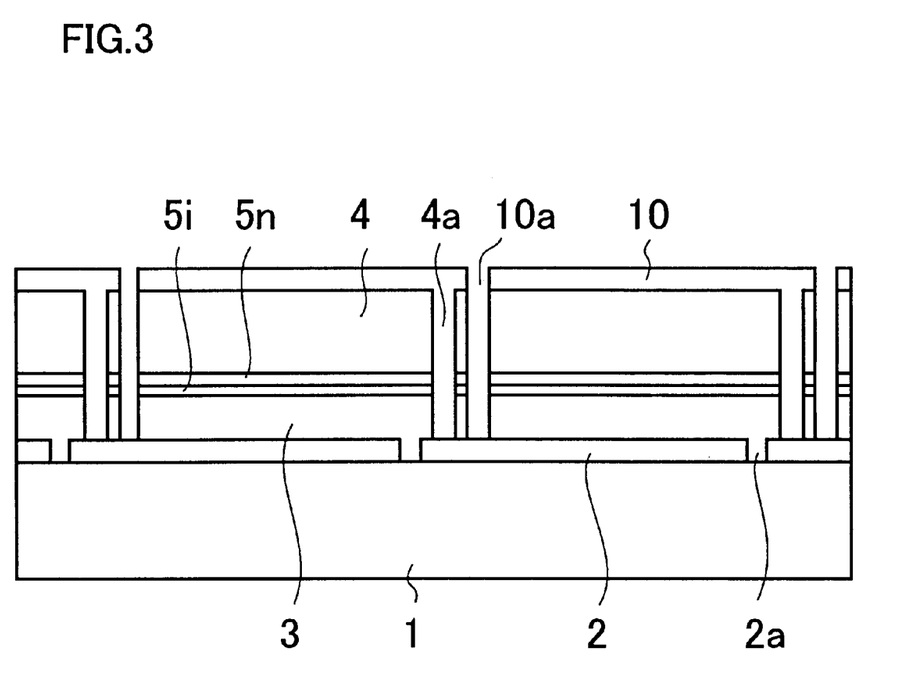
FIG. 3 is a schematic cross section showing an integrated hybrid thin-film solar battery including a semiconductor stacked-layer structure of the embodiment shown in FIG. 2.

FIG. 3 illustrates a schematic cross section of an integrated hybrid thin-film solar battery manufactured for experimental example 1. In manufacturing the solar cell, formed on a glass substrate 1 was a transparent electrode layer 2 of a tin oxide film having a fine uneven surface structure (surface texture). Transparent electrode layer 2 was then divided into a plurality of strip-like transparent electrode regions by grooves 2a formed by laser scribing with a YAG laser. Namely, grooves 2a dividing the transparent electrode layer extend in the direction orthogonal to the plane of the drawing (FIG. 3).

After this, on transparent electrode 2, a p-i-n-type amorphous photoelectric conversion unit 3 was formed by plasma CVD using a source gas containing $SiH_4$ and $H_2$ at a substrate temperature of 185° C. A p-type silicon layer included in amorphous photoelectric conversion unit 3 was deposited to a thickness of 10 nm. A non-doped i-type amorphous silicon photoelectric conversion layer was deposited to a thickness of 0.24 μm. An n-type silicon layer was deposited to a thickness of 8 nm under the condition that the gas flow ratio of $SiH_4/PH_3$ (in the state diluted to 0.5% with $H_2$)/$H_2$ was 1/0.6/100. Further, an i-type boundary layer 5i was deposited to a thickness of 4 nm with the flow ratio of $PH_3$ set at zero.

The substrate 1 was thereafter transported into an unloading chamber of a CVD apparatus, the chamber was quickly filled with $N_2$ gas, substrate 1 was then removed therefrom to the atmosphere and thus a surface of i-type boundary layer 5i was exposed to the atmosphere.

Further, substrate 1 was set in a loading chamber of another CVD apparatus and then heated to a temperature of 185° C. After this, an n-type microcrystalline silicon layer 5n was deposited to a thickness of 30 nm and thereafter a p-i-n-type crystalline photoelectric conversion unit 4 was deposited. A p-type microcrystalline silicon layer included in crystalline photoelectric conversion unit 4 was deposited to a thickness of 15 nm, a non-doped i-type crystalline silicon photoelectric conversion layer was deposited to a thickness of 1.7 μm, and an n-type microcrystalline silicon layer was deposited to a thickness of 20 nm. A zinc oxide film of 60 nm thickness functioning as a part of a rear electrode layer 10 was further formed by sputtering to cover the top of crystalline photoelectric conversion unit 4.

The substrate was thereafter moved to the atmosphere and grooves 4a dividing the semiconductor layer were formed by laser scribing with a YAG laser. A 30 nm-thick zinc oxide film, a 200 nm-thick silver film and a 5 nm-thick titanium film that were included in rear electrode 10 were further formed each by sputtering. Finally, grooves 10a dividing the rear electrode were formed through laser scribing with a YAG laser so as to divide rear electrode layer 10 into a plurality of strip-like rear electrodes. In this way, the integrated hybrid thin-film solar battery was manufactured as shown in FIG. 3 having strip-like hybrid cells laterally adjacent to each other and electrically connected in series.

The photoelectric conversion characteristics of the integrated hybrid thin-film solar battery manufactured for experimental example 1 were measured by irradiating the cell with light of AM 1.5 with an energy density of 1 kW/m$^2$ and at a temperature of 25° C. by means of a solar simulator.

REFERENTIAL EXAMPLE 1

An integrated hybrid thin-film solar battery for referential example 1 was manufactured, referential example 1 being different from experimental example 1 in the following respect only. Specifically, immediately after an n-type layer included in an amorphous photoelectric conversion unit 3 was deposited to a thickness of 30 nm, a crystalline photoelectric conversion unit 4 was deposited without formation of the i-type boundary layer 5i and additional n-type microcrystalline layer 5n and without removal of the substrate into the atmosphere. The integrated hybrid thin-film solar battery thus manufactured by the method for referential example 1 was also irradiated with light under the same conditions as those for experimental example 1 described above to measure the photoelectric conversion efficiency.

COMPARATIVE EXAMPLE 1

A manufacturing method for comparative example 1 was different from that for experimental example 1 only in that i-type boundary layer 5i was not formed for comparative example 1. An integrated hybrid thin-film solar battery manufactured by the method for comparative example 1 was also irradiated with light under the same conditions as those for experimental example 1 to measure the photoelectric conversion efficiency.

Specifically, photoelectric conversion characteristics regarding three samples for each of experimental example 1, referential example 1 and comparative example 1 were measured as described above. Table 1 shows the photoelectric conversion efficiency of the integrated hybrid thin-film solar batterys for experimental example 1 and comparative example 1 that is normalized on the basis of the photoelectric conversion efficiency of the integrated hybrid thin-film solar battery for referential example 1.

TABLE 1

| sample | No. 1 | No. 2 | No. 3 |
|---|---|---|---|
| referential example 1 | 1 | 1 | 1 |
| experimental example 1 | 0.982 | 0.970 | 0.987 |
| comparative example 1 | 0.969 | 0.917 | 0.924 |

As seen from Table 1, the integrated hybrid thin-film solar battery with its substrate exposed to the atmosphere after formation of i-type boundary layer 5i exhibits a resultant photoelectric conversion efficiency declining merely by maximum about 3% as compared with the integrated hybrid thin-film solar battery for referential example 1 that has amorphous photoelectric conversion unit 3 and crystalline photoelectric conversion unit 4 successively formed without formation of i-type boundary layer 5i.

It is noted that, for referential example 1, amorphous photoelectric conversion unit 3 and crystalline photoelectric conversion unit 4 were successively formed by plasma CVD at a constant temperature of 185° C., since change of the temperature was difficult due to the heat capacity of a substrate holder. Then, in order to clearly compare experimental example 1 with referential example 1, amorphous photoelectric conversion unit 3 and crystalline photoelectric conversion unit 4 for experimental example 1 were also deposited at a substrate temperature of 185° C. which was kept constant. However, the deposition temperature of amorphous photoelectric conversion unit 3 is more preferably 200° C. and that of crystalline photoelectric conversion unit 4 is more preferably 150° C. Therefore, if these optimum temperatures were employed for experimental example 1, the thin-film solar cell for experimental example 1 could have its photoelectric conversion efficiency improved even as compared with that for referential example 1.

On the other hand, it is seen from Table 1 that the photoelectric conversion efficiency for comparative example 1 is apparently inferior to that for experimental example 1, since the n-type layer included in amorphous photoelectric conversion unit 3 was exposed to the atmosphere without formation of i-type boundary layer 5i.

Figure 4:
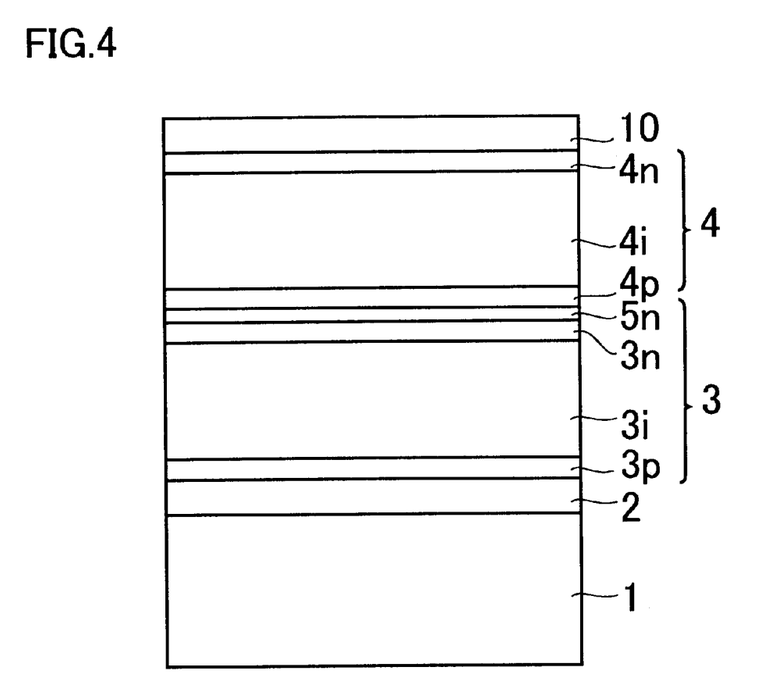
FIG. 4 is a schematic cross section showing a tandem thin-film solar cell manufactured by a method according to still another embodiment of the present invention.

FIG. 4 shows a schematic cross section of a tandem thin-film solar cell manufactured according to still another embodiment of the present invention. Specifically, this solar cell includes an electrode 2 of transparent conductive oxide (TCO) formed on a transparent insulating substrate 1 of glass for example. On transparent electrode 2, a first photoelectric conversion unit 3 is formed including a p-type layer 3p, an amorphous or crystalline photoelectric conversion layer 3i of substantially intrinsic semiconductor and an n-type layer 3n that are deposited successively by plasma CVD.

Substrate 1 is thereafter removed from a plasma CVD apparatus into the atmosphere to expose a surface of n-type layer 3n to the atmosphere. Then, substrate 1 is moved into another plasma CVD apparatus and exposed to hydrogen plasma so as to clean up or improve the surface layer of n-type layer 3n which has been contaminated or deteriorated due to exposure to the atmosphere. Preferably, on n-type layer 3n having been subjected to hydrogen plasma, a fresh and additional n-type microcrystalline intermediate layer 5n is deposited by plasma CVD, the additional n-type intermediate layer being capable of functioning to facilitate crystallization of a subsequently formed crystalline photoelectric conversion unit 4. On n-type microcrystalline intermediate layer 5n, a p-type layer 4p, a substantially intrinsic crystalline photoelectric conversion layer 4i and n-type layer 4n that are included in the second photoelectric conversion unit 4 are deposited successively by plasma CVD, and finally, a rear electrode 10 is formed.

The hydrogen plasma exposure process can be carried out under a gas pressure substantially the same as that for subsequent plasma CVD for depositing n-type intermediate layer 5n and p-type layer 4p. In other words, even if the processes for hydrogen plasma exposure and formation of n-type intermediate layer 5n are added, the time required accordingly for adjusting the gas pressure can be kept considerably short.

By this method of manufacturing a tandem thin-film solar cell, it is possible to clean up or improve, through the hydrogen plasma exposure process, the surface layer of n-type layer 3n in the first photoelectric conversion unit 3 that might be degraded due to exposure to the atmosphere. Namely, the hydrogen plasma serves to clean up the surface of n-type layer 3n and further to promote crystallization of the surface or eliminate amorphous component thereof. Moreover, fresh n-type microcrystalline intermediate layer 5n additionally formed on the cleaned or improved n-type layer 3n serves to facilitate crystallization of crystalline photoelectric conversion unit 4 to be deposited thereon. These effects provided by the hydrogen plasma and intermediate layer 5n enable crystalline unit 4 to have good crystalline properties as compared with in the case that crystalline unit 4 is directly deposited on n-type layer 3n having been exposed to the atmosphere and not exposed to hydrogen plasma. Accordingly, any adverse influence caused by temporary removal of substrate 1 into the atmosphere can remarkably be reduced.

Figure 5:
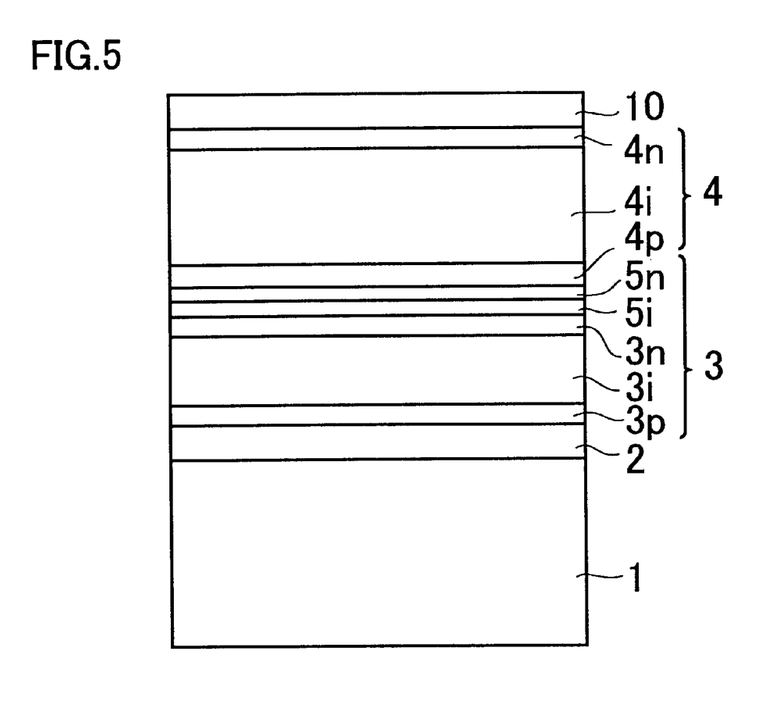
FIG. 5 is a schematic cross section showing a hybrid thin-film solar cell manufactured by a method according to a further embodiment of the present invention.

FIG. 5 shows a schematic cross section of a tandem thin-film solar cell manufactured by a method according to a further embodiment of the present invention. The embodiment shown in FIG. 5 is similar to that in FIG. 4. A difference therebetween is that, for the embodiment in FIG. 5, an additional i-type intermediate layer 5i of substantially intrinsic semiconductor which can cause the tunnel effect is deposited to a thickness of 5 nm or smaller by plasma CVD after deposition of an n-type layer 3n included in a first photoelectric conversion unit 3. After this i-type intermediate layer 5i is deposited, a substrate 1 is removed from a plasma CVD apparatus into the atmosphere to expose i-type intermediate layer 5 to the atmosphere.

In this case, i-type layer 5i of intrinsic semiconductor is advantageous compared with n-type layer 3n in that the surface of i-type layer 5i is less likely to be degraded even if exposed to the atmosphere. In addition i-type intermediate layer 5i having the thickness of 5 nm or smaller which is small enough to cause the tunnel effect and accordingly it never interrupt flow of electric current.

After i-type intermediate layer 5i is exposed to the atmosphere, it is exposed to hydrogen plasma as done for the embodiment in FIG. 4. Then, an n-type microcrystalline intermediate layer 5n and a crystalline photoelectric conversion unit 4 are deposited by plasma CVD.

N-type microcrystalline intermediate layer 5n is formed for both of the embodiments shown in FIGS. 4 and 5. The intermediate layer 5n serves to supplement the function of n-type layer 3n in the first photoelectric conversion unit 3 and thus can be regarded as a part of the n-type layer included in the first photoelectric conversion unit 3. However, the n-type intermediate layer 5n is not necessarily required and therefore may be omitted. Alternatively, n-type layer 3n may be formed to a thickness enough for being a microcrystalline layer of good quality so that the surface layer thereof, which has been exposed to the atmosphere and might be degraded, can be refreshed by being exposed to hydrogen plasma. In such a case, crystalline photoelectric conversion unit 4 can directly be deposited on the refreshed surface by plasma CVD.

Experimental examples of the method of manufacturing an integrated hybrid thin-film solar battery including a stacked structure corresponding to the embodiments shown in FIGS. 4 and 5 are hereinafter described in conjunction with FIG. 6 together with a referential example and a comparative example.

EXPERIMENTAL EXAMPLE 2

Figure 6:
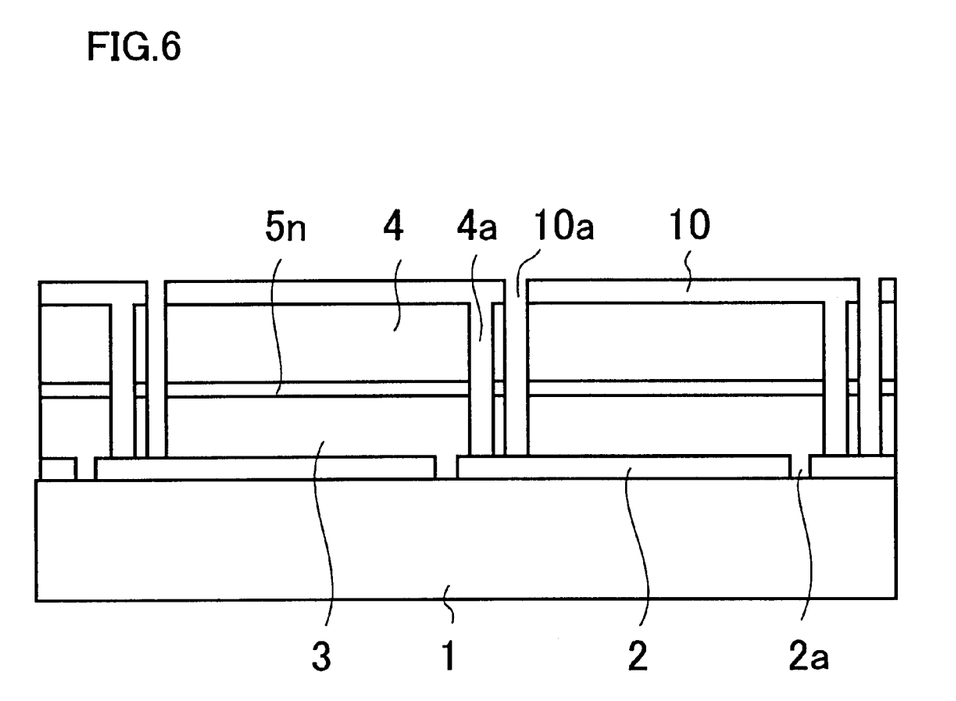
FIG. 6 is a schematic cross section showing an integrated hybrid thin-film solar battery including a semiconductor stacked-layer structure of the embodiment shown in FIG. 4.

FIG. 6 illustrates a schematic cross section of an integrated hybrid thin-film solar battery manufactured for experimental example 2. In manufacturing this solar cell, formed on a glass substrate 1 was a transparent electrode layer 2 of a tin oxide film having a fine uneven surface structure (surface texture). Transparent electrode layer 2 was then divided into a plurality of strip-like transparent electrode regions by grooves 2a formed by laser scribing with a YAG laser.

After this, on transparent electrode 2, a p-i-n-type amorphous photoelectric conversion unit 3 was formed by plasma CVD using a source gas containing $SiH_4$ and $H_2$ at a substrate temperature of 175° C. A p-type silicon layer 3p included in amorphous photoelectric conversion unit 3 was deposited to a thickness of 10 nm. A non-doped i-type amorphous silicon photoelectric conversion layer 3i was deposited to a thickness of 0.27 μm. An n-type silicon layer 3n was deposited to a thickness of 12 nm to serve as a microcrystalline layer under the condition that the gas flow ratio of $SiH_4/PH_3$ (in the state diluted to 0.5% with $H_2$)/$H_2$ was 1/4/96.

The substrate 1 was thereafter transported into an unloading chamber of a CVD apparatus, the chamber was quickly filled with $N_2$ gas, substrate 1 was then removed therefrom to the atmosphere and then a surface of n-type silicon layer 3n was exposed to the atmosphere for 40 or 80 hours.

Moreover, substrate 1 was set in a loading chamber of another CVD apparatus and then heated to a temperature of 175° C. After this, the surface of n-type microcrystalline silicon layer 3n was exposed for 30 to 60 seconds to hydrogen plasma under the condition that the RF (radio frequency) power density was 0.1 to 0.2 W/cm². The RF power source was then turned off and the pressure of the mixed gas $SiH_4/PH_3/H_2$ was adjusted without evacuating once to a high vacuum. An n-type microcrystalline intermediate layer 5n was thereafter deposited to a thickness of 30 nm and subsequently a p-i-n-type crystalline photoelectric conversion unit 4 was deposited. A p-type microcrystalline silicon layer 4p included in crystalline photoelectric conversion unit 4 was deposited to a thickness of 15 nm, a non-doped i-type crystalline silicon photoelectric conversion layer 4i was deposited to a thickness of 1.7 μm and an n-type microcrystalline silicon layer 4n was deposited to a thickness of 20 nm. A zinc oxide film of 60 nm in thickness functioning as a part of a rear electrode layer 10 was further formed by sputtering to cover the top of crystalline photoelectric conversion unit 4.

The substrate was thereafter moved into the atmosphere and grooves 4a dividing the semiconductor layer were formed by laser scribing with a YAG laser. A 30 nm-thick zinc oxide film, a 200 nm-thick silver film and a 5 nm-thick titanium film that were included in rear electrode 10 were further formed each by sputtering. Finally, grooves 10a dividing the rear electrode were formed through laser scribing with a YAG laser so as to divide rear electrode layer 10 into a plurality of strip-like rear electrodes. In this way, the integrated hybrid thin-film solar battery was manufactured as shown in FIG. 6 having strip-like hybrid cells laterally adjacent to each other and electrically connected in series.

Table 2 provides a summary of gas mixture ratio, pressure and time for adjusting pressure (pressure-adjusting time) regarding the reaction gases used for depositing each layer included in the thin-film solar cell for this experimental example.

TABLE 2

| | mixture ratio of reaction gases | | | | | pressure | pressure-adjusting time |
|---|---|---|---|---|---|---|---|
| | $SiH_4$ | $H_2$ | $B_2H_6$ | $PH_3$ | $CH_4$ | (Pa) | (sec) |
| p-layer 3p | 1 | 12 | 0.2% | — | 2 | 100–150 | 60 |
| i-layer 3i | 1 | — | — | — | — | 30–60 | 90 |
| n-layer 3n | 1 | 100 | — | 0.02 | — | 133 | 60 |
| hydrogen plasma | — | 100 | — | — | — | 133 | 60 |
| n-layer 5n | 1 | 100 | — | 0.02 | — | 133 | 15 |
| p-layer 4p | 1 | 200 | 0.1% | — | — | 133 | 20 |
| i-layer 4i | 1 | 50 | — | — | — | 600–800 | 90 |
| n-layer 4n | 1 | 100 | — | 0.02 | — | 133 | 60 |

As seen from Table 2, the gas pressure for the hydrogen plasma exposure process and the gas pressure for depositing n-type intermediate layer 5n formed after the hydrogen plasma exposure can be the same as the gas pressure for subsequently depositing p-type layer 4p, namely 133 Pa. Then, the time for adjusting the pressure required for depositing n-type intermediate layer 5n and p-type layer 4p can be made short, i.e., 35 seconds in total. In other words, even if the processes for hydrogen plasma exposure and deposition of n-type intermediate layer 5n are added, the pressure-adjusting time required can be kept short so that the additional processes have almost no adverse influence on the time efficiency of the deposition processes of the thin-film solar cell.

The photoelectric conversion characteristics of the integrated hybrid thin-film solar battery manufactured for experimental example 2 were measured by irradiating the cell with light of AM 1.5 with an energy density of 1 kW/m² and at a temperature of 25° C. by means of a solar simulator.

Measured characteristics represented by relative values are shown in Table 3.

EXPERIMENTAL EXAMPLE 3

Experimental example 3 differed from experimental example 2 only in that the thickness of the n-type microcrystalline layer 3n was reduced to 8 nm, an i-type intermediate layer 5i was deposited to a thickness of 4 nm on the n-type layer 3n with non-dope of $PH_3$ and substrate 1 was thereafter moved into the atmosphere.

EXPERIMENTAL EXAMPLE 4

Experimental example 4 differed from experimental example 3 only in that the additional n-type microcrystalline intermediate layer 5n was omitted.

REFERENTIAL EXAMPLE 2

Referential example 2 differed from experimental example 2 only in that the n-type microcrystalline layer 3n was deposited to 30 nm in thickness and immediately thereafter crystalline photoelectric conversion unit 4 was deposited without exposure of the substrate to the atmosphere.

COMPARATIVE EXAMPLE 2

Comparative example 2 differed from experimental example 2 only in that the hydrogen plasma exposure process was not performed.

Regarding four samples (N=4) for each of experimental examples 2-4, referential example 2 and comparative example 2, the photoelectric conversion characteristics were measured. Table 3 shows the photoelectric conversion efficiency of the integrated hybrid thin-film solar batteries for experimental examples 2–4 and comparative example 2 that is normalized on the basis of the photoelectric conversion efficiency of the integrated hybrid thin-film solar battery for referential example 2.

TABLE 3

|  | exposure to atmosphere | maximum | minimum | average of N = 4 samples |
|---|---|---|---|---|
| experimental example 2 | 40 hrs | 0.999 | 0.996 | 0.998 |
|  | 80 hrs | 0.998 | 0.964 | 0.985 |
| experimental example 3 | 40 hrs | 1.001 | 0.996 | 0.998 |
|  | 80 hrs | 0.998 | 0.996 | 0.997 |
| experimental example 4 | 40 hrs | 1.003 | 0.997 | 0.998 |
| referential example 2 | 0 | 1.000 | 1.000 | 1.000 |
| comparative example 2 | 40 hrs | 0.994 | 0.949 | 0.977 |

As seen from Table 3, even if substrate 1 is left in the atmosphere for 40 hours after n-type layer 3n is formed as done for experimental example 2, the photoelectric conversion efficiency is lower only by the negligible degree as a measurement error (less than 0.5% in relative value) than that for referential example 2 where crystalline unit 4 is formed immediately after amorphous unit 3 is formed without removing the substrate into the atmosphere.

It is also seen from experimental example 3 that the time for leaving substrate 1 in the atmosphere can be extended up to 80 hours after i-type intermediate layer 5i is formed. It is further seen from experimental example 4 that n-type intermediate layer 5n may be omitted.

On the other hand, comparative example 2 where substrate 1 is removed into the atmosphere after formation of n-type layer 3n while no hydrogen plasma exposure process is performed exhibits the photoelectric conversion efficiency lower than that for referential example 2 by a minimum of at least 0.5% or and a maximum of at least 5% in relative value.

Preferably, the time for hydrogen plasma exposure process is limited to 120 seconds or shorter, since longer hydrogen plasma exposure time rather deteriorates the photoelectric conversion characteristics. The reason for this deterioration is presumed that the hydrogen plasma exposure process continued for too long time could cause hydrogen radical to damage even i-type amorphous photoelectric conversion layer 3i.

Figure 7:
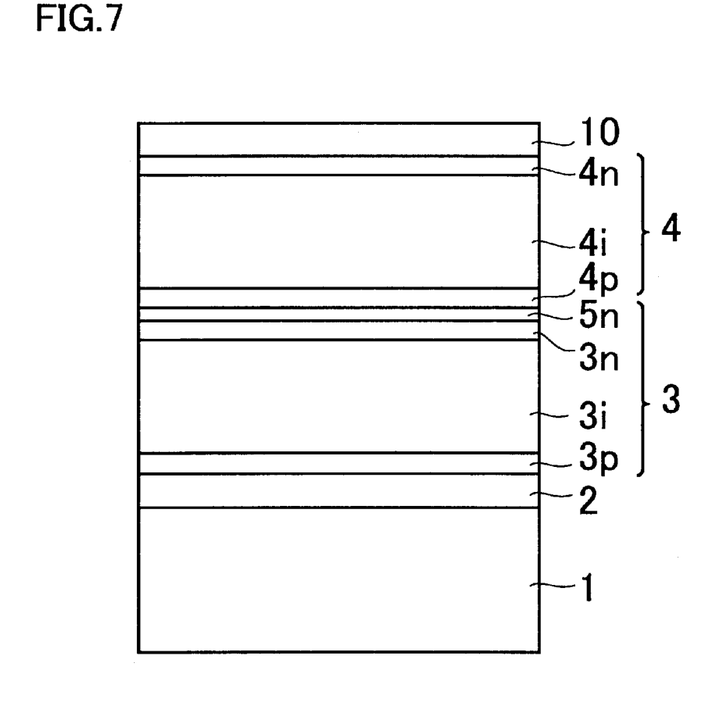
FIG. 7 is a schematic cross section showing a tandem thin-film solar cell manufactured by a method according to a still further embodiment of the present invention.

FIG. 7 shows a schematic cross section of a tandem thin-film solar cell manufactured by a method according to a still further embodiment of the present invention. Specifically, this solar cell includes a electrode 2 of transparent conductive oxide (TCO) formed on a transparent insulating substrate 1 of glass for example. On transparent electrode 2, a first photoelectric conversion unit 3 is formed including a p-type layer 3p, an amorphous or crystalline photoelectric conversion layer 3i of substantially intrinsic semiconductor and an n-type layer 3n that are deposited successively by plasma CVD.

Here, the dopant concentration of n-type layer 3n is made lower than that of an n-type layer which is included in a usual photoelectric conversion unit. Specifically, the dopant concentration here is less than $1.5 \times 10^{20}$ cm$^{-3}$. This is because the lower dopant concentration of n-type layer 3n renders the surface of n-type layer 3n less likely to be oxidized and less likely to become porous.

Substrate 1 is thereafter removed from a plasma CVD apparatus into the atmosphere to expose the surface of n-type layer 3n to the atmosphere. Then, substrate 1 is transported into another plasma CVD apparatus and preferably the surface layer of n-type layer 3n is exposed to hydrogen plasma so that the surface layer of n-type layer 3n having been exposed to the atmosphere and accordingly contaminated or deteriorated is cleaned up or improved. It is noted that this hydrogen plasma exposure process is dispensable and thus may be omitted.

On n-type layer 3n, an additional fresh n-type microcrystalline intermediate layer 5n which can serve to facilitate crystallization of a crystalline photoelectric conversion unit 4 to be formed subsequently is deposited by plasma CVD. The dopant concentration of n-type intermediate layer 5n is made relatively high to compensate for the low dopant concentration of n-type layer 3n. Specifically, the dopant concentration of intermediate layer 5n is $5 \times 10^{20}$ cm$^{-3}$ or higher. Namely, n-type intermediate layer 5n serves to compensate for a part of the function of n-type layer 3n in the first photoelectric conversion unit 3 and thus can be regarded as a part of the n-type layer included in the first photoelectric conversion unit 3.

On n-type microcrystalline intermediate layer 5n, a second photoelectric conversion unit 4 is formed including a p-type layer 4p, a substantially intrinsic crystalline photoelectric conversion layer 4i and an n-type layer 4n that are successively deposited by plasma CVD, and a rear electrode 10 is finally formed.

The hydrogen plasma exposure process can be carried out under a gas pressure substantially the same as that for subsequent plasma CVD for depositing n-type intermediate layer 5n and p-type layer 4p. In other words, even if the processes for hydrogen plasma exposure and formation of n-type intermediate layer 5n are added, the time required for adjusting the gas pressure can be kept considerably short.

According to this method of manufacturing a tandem thin-film solar cell, even if n-type layer 3n in the first photoelectric conversion unit 3 is exposed to the atmosphere, the low dopant concentration thereof allows the surface layer of n-type layer 3n to be less likely to be degraded. Degradation possibly to a slight degree can be addressed by cleaning up or improving the surface layer through hydrogen plasma exposure process. The hydrogen plasma thus serves to clean up the surface of n-type layer 3n and further to promote crystallization of the surface or eliminate amorphous component thereof. Moreover, fresh n-type microcrystalline intermediate layer 5n which is additionally formed on the n-type layer 3n serves to facilitate crystallization of crystalline photoelectric conversion unit 4 to be deposited on the intermediate layer 5n. These effects provided by the hydrogen plasma and intermediate layer 5n enable crystalline unit 4 to have good crystalline properties as compared with in the case that crystalline unit 4 is directly deposited on n-type layer 3n having the usual dopant concentration and having been exposed to the atmosphere and not exposed to hydrogen plasma. Accordingly, any adverse influence caused by temporary removal of substrate 1 into the atmosphere can remarkably be reduced.

Experimental examples of the method of manufacturing an integrated hybrid thin-film solar battery including a stacked structure corresponding to the embodiment shown in FIG. 7 are hereinafter described in conjunction with FIG. 8 together with a referential example and a comparative example.

EXPERIMENTAL EXAMPLE 5

Figure 8:
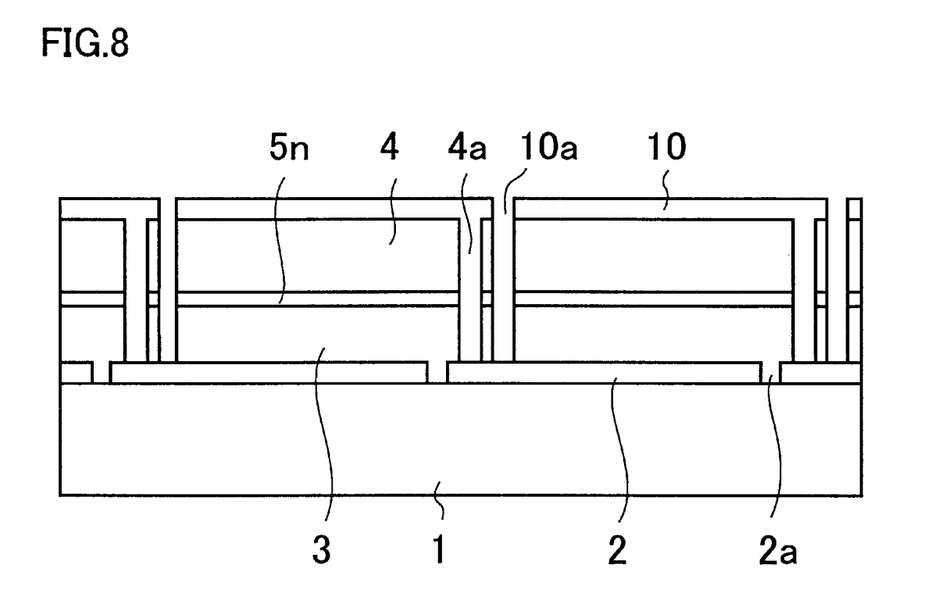
FIG. 8 is a schematic cross section showing an integrated hybrid thin-film solar battery including a semiconductor stacked-layer structure of the embodiment shown in FIG. 7.

FIG. 8 illustrates a schematic cross section of an integrated hybrid thin-film solar battery manufactured for experimental example 5. In manufacturing this solar cell, formed on a glass substrate 1 is a transparent electrode layer 2 of a tin oxide film having a fine uneven surface structure (surface texture). Transparent electrode layer 2 was then divided into a plurality of strip-like transparent electrode regions by grooves 2a formed by laser scribing with a YAG laser.

After this, on transparent electrode layer 2, a p-i-n-type amorphous photoelectric conversion unit 3 was formed by plasma CVD using a source gas containing $SiH_4$ and $H_2$ at a substrate temperature of 175° C. A p-type silicon layer 3p included in amorphous photoelectric conversion unit 3 was deposited to a thickness of 10 nm. A non-doped i-type amorphous silicon photoelectric conversion layer 3i was deposited to a thickness of 0.27 μm. An n-type silicon layer 3n was deposited to a thickness of 8 nm to serve as a microcrystalline layer under the condition that the gas flow ratio of $SiH_4/PH_3$ (in the state diluted to 0.5% with $H_2$)/$H_2$ was 1/0.4/100. Here, the doping concentration of P relative to Si was $1 \times 10^{20}$ $cm^{-3}$.

The substrate 1 was thereafter transported into an unloading chamber of a CVD apparatus, the chamber was quickly filled with $N_2$ gas, substrate 1 was then removed therefrom to the atmosphere and thus a surface of n-type silicon layer 3n was exposed to the atmosphere for 40 hours.

Moreover, substrate 1 was set in a loading chamber of another CVD apparatus and then heated to a temperature to 175° C. After this, the surface of n-type microcrystalline silicon layer 3n was exposed for 30 to 60 seconds to hydrogen plasma under the condition that the RF (radio frequency) electrical power density was 0.1 to 0.2 $W/cm^2$. The RF power source was then turned off and the pressure of the mixed gas $SiH_4/PH_3$ (diluted gas)/$H_2$ was adjusted without evacuating once to a high vacuum. An n-type microcrystalline silicon intermediate layer 5n was thereafter deposited to a thickness of 30 nm and subsequently a p-i-n-type crystalline photoelectric conversion unit 4 was deposited. Here, the doping concentration of P in n-type intermediate layer 5n was $1 \times 10^{21}$ $cm^{-3}$.

A p-type microcrystalline silicon layer 4p included in crystalline photoelectric conversion unit 4 was deposited to a thickness of 15 nm, a non-doped i-type crystalline silicon photoelectric conversion layer 4i was deposited to a thickness of 1.7 μm and an n-type microcrystalline silicon layer 4n was deposited to a thickness of 20 nm. A zinc oxide film of 60 nm in thickness functioning as a part of a rear electrode layer 10 was further formed by sputtering to cover the top of crystalline photoelectric conversion unit 4.

The substrate was thereafter moved into the atmosphere and grooves 4a dividing the semiconductor layer were formed by laser scribing with a YAG laser. A 30 nm-thick zinc oxide film, a 200 nm-thick silver film and a 5 nm-thick titanium film that were included in rear electrode 10 were further formed each by sputtering. Finally, grooves 10a dividing the rear electrode were formed through laser scribing with a YAG laser so as to divide rear electrode layer 10 into a plurality of strip-like rear electrodes. In this way, the integrated hybrid thin-film solar battery was manufactured as shown in FIG. 8 having strip-like hybrid cells laterally adjacent to each other and electrically connected in series.

Table 4 provides a summary of gas mixture ratio, pressure and time for adjusting pressure (pressure-adjusting time) regarding the reaction gases used for depositing each layer included in the thin-film solar cell for this experimental example 5.

TABLE 2

| | mixture ratio of reaction gases | | | | | pressure | pressure-adjusting time |
|---|---|---|---|---|---|---|---|
| | $SiH_4$ | $H_2$ | $B_2H_6$ | $PH_3$ | $CH_4$ | (Pa) | (sec) |
| p-layer 3p | 1 | 12 | 0.2% | — | 2 | 100–150 | 60 |
| i-layer 3i | 1 | — | — | — | — | 30–60 | 90 |
| n-layer 3n | 1 | 100 | — | 0.002 | — | 133 | 60 |
| hydrogen plasma | — | 100 | — | — | — | 133 | 60 |
| n-layer 5n | 1 | 100 | — | 0.02 | — | 133 | 15 |
| p-layer 4p | 1 | 200 | 0.1% | — | — | 133 | 20 |
| i-layer 4i | 1 | 50 | — | — | — | 600–800 | 90 |
| n-layer 4n | 1 | 100 | — | 0.02 | — | 133 | 60 |

As seen from Table 4, the gas pressure for the hydrogen plasma exposure process and the gas pressure for depositing n-type intermediate layer 5n to be formed after the hydrogen plasma exposure can be the same as the gas pressure for subsequently depositing p-type layer 4p, namely 133 Pa. Then, the time for adjusting the pressure required for depositing n-type intermediate layer 5n and p-type layer 4p can be made short, i.e., 35 seconds in total. In other words, even if the processes for hydrogen plasma exposure and deposition of n-type intermediate layer 5n are added, the pressure-adjusting time required can be kept short so that the additional processes have almost no adverse influence on the time efficiency of the deposition processes of the thin-film solar cell.

The photoelectric conversion characteristics of the integrated hybrid thin-film solar battery manufactured for experimental example 5 were measured by irradiating the cell with light of AM 1.5 with an energy density of 1 $kW/m^2$ and at a temperature of 25° C. by means of a solar simulator. Measured characteristics represented by relative values are shown in Table 5.

EXPERIMENTAL EXAMPLE 6

Experimental example 6 differed from experimental example 5 only in that the hydrogen plasma exposure process was omitted.

REFERENTIAL EXAMPLE 3

Referential example 3 differed from experimental example 5 only in that n-type microcrystalline layer 3n had a dopant density increased to the usual one, i.e., $1 \times 10^{21}$ $cm^{-3}$ and had a thickness of 30 nm, and immediately thereafter crystalline photoelectric conversion unit 4 was deposited without exposure of the substrate to the atmosphere.

COMPARATIVE EXAMPLE 3

Comparative example 3 differed from experimental example 6 only in that n-type microcrystalline layer 3n had a dopant density increased to the usual $1 \times 10^{21}$ $cm^{-3}$.

Regarding four samples (N=4) for each of experimental examples 5 and 6, referential example 3 and comparative example 3, the photoelectric conversion characteristics were measured. Table 5 shows the photoelectric conversion efficiency of the integrated hybrid thin-film solar batteries for experimental examples 5 and 6 and comparative example 3 that is normalized on the basis of the photoelectric conversion efficiency of the integrated hybrid thin-film solar battery for referential example 3.

TABLE 5

| | exposure to atmosphere | maximum | minimum | average of N = 4 samples |
|---|---|---|---|---|
| experimental example 5 | 40 hrs | 1.002 | 0.998 | 0.999 |
| experimental example 6 | 40 hrs | 0.999 | 0.982 | 0.991 |
| referential example 3 | 0 | 1.000 | 1.000 | 1.000 |
| comparative example 3 | 40 hrs | 0.991 | 0.933 | 0.952 |

As seen from Table 5, even if substrate 1 is left in the atmosphere for 40 hours after n-type layer 3n with the low concentration is formed as done for experimental example 5, the photoelectric conversion efficiency has almost no deterioration as compared with referential example 3 where crystalline unit 4 is formed immediately after amorphous unit 3 is formed without removing the substrate into the atmosphere.

Further, as seen from experimental example 6 where hydrogen plasma exposure process is omitted, the low-concentration n-type layer 3n can be used according to the manufacturing method of the present invention so that the photoelectric conversion efficiency is lower than that of referential example 3 only by a maximum of 2% or less and only by approximately 1% in relative value on the average.

On the other hand, comparative example 3 where n-type layer 3n in amorphous photoelectric conversion unit 3 has the usual dopant density exhibits considerably varying characteristics of the resultant thin-film solar cell and exhibits a great deterioration of the efficiency by approximately 5% in relative value on the average compared with referential example 3.

As heretofore discussed, according to the present invention, a method of manufacturing a tandem thin-film solar cell can be provided to enhance the flexibility of the manufacturing process and improve the production efficiency.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a tandem thin-film solar cell including a plurality of photoelectric conversion units stacked on a substrate, said photoelectric conversion units each including a p-type layer, an i-type photoelectric conversion layer and an n-type layer formed in this order from a light-incident side of said solar cell, and at least a rear unit among said photoelectric conversion units furthest from the light-incident side being a crystalline unit including a crystalline i-type photoelectric conversion layer, said method comprising the steps of:

forming at least one of said units on said substrate by plasma CVD and immediately thereafter forming an i-type boundary layer to a thickness of at most 5 nm by plasma CVD; and removing thereafter said substrate into the atmosphere to expose a surface of said i-type boundary layer to the atmosphere and then forming a crystalline unit on said i-type boundary layer by plasma CVD.

2. The method of manufacturing a tandem thin-film solar cell according to claim 1, wherein said photoelectric conversion units each include a p-type layer, an i-type photoelectric conversion layer and an n-type layer in this order from said substrate, and an additional n-type layer is formed by plasma CVD immediately before said crystalline unit is formed on said i-type boundary layer.

3. The method of manufacturing a tandem thin-film solar cell according to claim 2, wherein an amorphous unit including an amorphous i-type photoelectric conversion layer is formed on said substrate as a firstly formed unit and as a front unit closest to the light-incident side.

4. The method of manufacturing a tandem thin-film solar cell according to claim 1, wherein a source gas containing $SiH_4$ diluted with $H_2$ is used for said plasma CVD.

5. A method of manufacturing a tandem thin-film solar cell including a plurality of stacked photoelectric conversion units, said photoelectric conversion units each including a p-type layer, an i-type photoelectric conversion layer and an n-type layer deposited in this order on a transparent substrate, and at least a rear unit among said photoelectric conversion units furthest from said substrate being a crystalline unit including a crystalline i-type photoelectric conversion layer, said method comprising the steps of:

forming at least one of said units on said substrate by plasma CVD and thereafter removing said substrate into the atmosphere to expose, to the atmosphere, an outermost surface of said unit having already been formed; and exposing the outermost surface to hydrogen plasma and immediately thereafter forming said crystalline unit by plasma CVD.

6. The method of manufacturing a tandem thin-film solar cell according to claim 5, wherein at least one of said units is formed on said substrate by plasma CVD, an i-type boundary layer is immediately thereafter formed to a thickness of at most 5 nm by plasma CVD and then said substrate is removed into the atmosphere.

7. The method of manufacturing a tandem thin-film solar cell according to claim 5, wherein substantially the same gas pressure is used in the same vacuum chamber to expose the outermost surface of said unit exposed to the atmosphere to the hydrogen plasma and to thereafter deposit said p-type layer of said crystalline unit by plasma CVD.

8. The method of manufacturing a tandem thin-film solar cell according to claim 5, wherein after said exposure to hydrogen plasma and before deposition of said p-type layer of said crystalline unit, an additional n-type microcrystalline intermediate layer is deposited by plasma CVD, and said n-type microcrystalline intermediate layer is deposited at substantially the same gas pressure as a gas pressure at which said exposure to hydrogen plasma is performed.

9. The method of manufacturing a tandem thin-film solar cell according to claim 5, wherein said exposure to hydrogen plasma is performed within two minutes.

10. The method of manufacturing a tandem thin-film solar cell according to claim 5, wherein an amorphous unit including an amorphous i-type photoelectric conversion layer is formed on said substrate as a firstly formed said unit.

11. The method of manufacturing a tandem thin-film solar cell according to claim 5, wherein a source gas containing $SiH_4$ diluted with $H_2$ is used for said plasma CVD.

12. A method of manufacturing a tandem thin-film solar cell including a plurality of stacked photoelectric conversion units, said photoelectric conversion units each including a p-type layer, an i-type photoelectric conversion layer and an n-type layer deposited in this order on a transparent substrate, and at least a rear unit among said photoelectric conversion units furthest from said substrate being a crystalline unit including a crystalline i-type photoelectric conversion layer, said method comprising the steps of:

forming said n-type layer included in at least one of said units on said substrate by plasma CVD with a relatively low dopant concentration and thereafter removing said substrate into the atmosphere to expose a surface of said low-concentration n-type layer to the atmosphere; and performing plasma CVD to thereafter form an n-type intermediate layer on said low-concentration n-type layer exposed to the atmosphere, said intermediate layer having a higher concentration than that of said low-concentration n-type layer, and immediately thereafter form said crystalline unit.

13. The method of manufacturing a tandem thin-film solar cell according to claim 12, wherein said low-concentration n-type layer has a dopant concentration less than $1.5 \times 10^{20}$ $cm^{-3}$ and said n-type intermediate layer with higher concentration has a dopant concentration more than $5 \times 10^{20}$ $cm^{-3}$.

14. The method of manufacturing a tandem thin-film solar cell according to claim 12, wherein the surface of said low-concentration n-type layer exposed to the atmosphere is further exposed to hydrogen plasma and immediately thereafter said n-type intermediate layer with higher concentration is formed by plasma CVD.

15. The method of manufacturing a tandem thin-film solar cell according to claim 14, wherein substantially the same gas pressure is used in the same vacuum chamber to expose the surface to hydrogen plasma, deposit said n-type intermediate layer by plasma CVD and deposit said p-type layer of said crystalline unit on said intermediate layer by plasma CVD.

16. The method of manufacturing a tandem thin-film solar cell according to claim 14, wherein said exposure to hydrogen plasma is performed within two minutes.

17. The method of manufacturing a tandem thin-film solar cell according to claim 12, wherein an amorphous unit including an amorphous i-type photoelectric conversion layer is formed on said substrate as a firstly formed said unit.

18. The method of manufacturing a tandem thin-film solar cell according to claim 12, wherein a source gas containing $SiH_4$ diluted with $H_2$ is used for said plasma CVD.

* * * * *